United States Patent
Wright

(10) Patent No.: US 8,543,876 B1
(45) Date of Patent: Sep. 24, 2013

(54) METHOD AND APPARATUS FOR SERIAL SCAN TEST DATA DELIVERY

(75) Inventor: Adam J. Wright, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 353 days.

(21) Appl. No.: 12/819,143

(22) Filed: Jun. 18, 2010

(51) Int. Cl.
*G01R 31/3177* (2006.01)
*G01R 31/40* (2006.01)

(52) U.S. Cl.
USPC ........................................... 714/728; 714/736

(58) Field of Classification Search
None
See application file for complete search history.

(56) References Cited

U.S. PATENT DOCUMENTS

| | | | |
|---|---|---|---|
| 4,894,830 A * | 1/1990 | Kawai | 714/731 |
| 5,260,947 A * | 11/1993 | Posse | 714/727 |
| 6,006,343 A * | 12/1999 | Whetsel | 714/28 |
| 7,080,789 B2 * | 7/2006 | Leaming | 235/492 |
| 7,373,561 B2 * | 5/2008 | Baumer et al. | 714/704 |
| 7,856,582 B2 * | 12/2010 | Cervantes et al. | 714/732 |
| 2009/0006914 A1 * | 1/2009 | Ko | 714/719 |

\* cited by examiner

*Primary Examiner* — Ajay Bhatia
*Assistant Examiner* — Dipakkumar Gandhi
(74) *Attorney, Agent, or Firm* — Womble Carlyle Sandridge & Rice, LLP

(57) ABSTRACT

A design for test (DFT) circuitry which delivers serial data serially is disclosed. The DFT circuit has a transceiver to receive serial data and then deserialize the serial data into deserialize data. The DFT circuit also has a control logic block which receives the deserialize data and stimulates at least one test element with the test data. The test element will generate an output response from the stimulus. The DFT circuit also has an output response block which receives the output from the test element and analyses the output response. Utilizing this DFT circuitry, a high speed data delivery method can be used for testing a device-under-test (DUT). Such method could reduce test time and the test cost associated with test process.

18 Claims, 5 Drawing Sheets

METHOD AND APPARATUS FOR SERIAL SCAN TEST DATA DELIVERY

BACKGROUND

Testing within the integrated circuit (IC) industry is a process of verification that the device manufactured is functionally acceptable to customer. The integrated circuit (IC) industry tests every IC devices before shipping to customers. In a test process, there are many test methods available to catch various defects introduced from the process and design. There was a point in time when the IC industry did not perform full coverage testing and performed sampling of IC devices in testing prior to shipping to customers to minimize the cost. However, as the technology node shrinks and process marginalities become smaller, practices such as sampling has been phased out and testing every one of the manufactured ICs has become the norm. Furthermore, the IC industry practices widest coverage testing to provide best quality manufactured ICs. With the progression of such changes, the cost associated with testing has become a significant factor in manufacturing an IC.

The IC industry typically uses a parallel delivery method to deliver scan test data into the ICs. The parallel delivery method provides scan test data directly to each of the inputs and outputs (IOs) of the device under test (DUT). So far, the parallel delivery method has provided an efficient manner to check each input and output (IO) of the DUT and provides feedback on the corresponding functionality. The parallel delivery method drives a signal from each tester 10 or driver to the designated 10 on the IC and then reads back the response from the IC.

There are drawbacks associated with parallel delivery method. For example, each 10 on the DUT requires an independent 10 or driver resource from the tester. Such a requirement poses problems when it comes to larger devices with multiple IOs. Furthermore, test interface from the tester resource to the DUT requires advanced technologies when testing a large device with multiple IOs. A common problem observed during the design of the test interface at the tester for the large devices using parallel data delivery is tight pitch trace requirements while maintaining adequate interconnection speed requirements. Balancing between these requirements incurs significantly higher testing cost due to their inverse relationship.

It is within this context that the embodiments described herein arise.

SUMMARY

Embodiments of the present invention provide methods for delivering scan test data serially and the associated design-for-test (DFT) circuitry that needs to be present within the integrated circuit (IC).

It should be appreciated that the present invention can be implemented in numerous ways, such as process, an apparatus, a system, a device or a method. Several inventive embodiments of the present invention are described below.

In one embodiment, a method of delivering scan test data serially for an integrated circuit is provided. The serial scan test data delivery method has data coming into a transceiver of the IC based on a serial protocol. The serial scan test data is converted into a deserialized scan test data within the transceiver. The deserialized scan test data is routed into a programming register through a control signal provided by a control block. The programming register then programs the scan register with the information on the core fabric routing and stimulus propagation. The data within the scan register is stored into a Capture Random Access Memory (RAM) for future transfer if the device under test (DUT) fails. The signal stimuli contained within the programming register is transferred to the core fabric and then propagates through the core fabric based on clock cycles through a shift register within the scan register. An output response generated after the propagation of stimulus across the core fabric is transferred into an output response block and stored. The stored output response in the output response block is contemporaneously compared to an expected output response.

In another embodiment, an integrated circuit is provided. The integrated circuit includes a design-for-test (DFT) circuitry to enable a method to deliver scan test data serially into an IC. The IC includes a transceiver block for receiving the serial scan data. The transceiver block is coupled to a control logic block. The transceiver block provides the deserialized scan test data to the control logic block. The control logic block is coupled to a core fabric and an output response block. The stimulus from control logic block is transmitted to a core fabric. The stimulus propagates across the core fabric and generates an output response. The output response block, which is coupled to the core fabric, receives the output response from the core fabric. The output response is compared with an expected output response and the comparison result is routed back to the control logic block.

In one embodiment of the control logic block includes a control block, a scan register, a programming register and a Capture RAM. The control block is coupled to the transceiver block, the scan register and the programming register. The control block receives the deserialized scan test data from the transceiver and then sequentially processes the deserialized scan test data to generate control signals. The programming register receives the deserialized scan test data which contains stimuli to stimulate the core fabric and information on programming the scan register on routing and propagation of the stimulus in the core fabric. The scan register has information on routing the core fabric and stimuli propagation across the core fabric. Each of the test processes within the IC is controlled through control information generated by control block.

Other aspects of the invention will become apparent from the following detailed description, taken in conjunction with the accompanying drawings, illustrating by way of example the principles of the invention.

BRIEF DESCRIPTION OF THE DRAWINGS

The invention may be understood by reference to the following description taken in conjunction with the accompanying drawings.

DETAILED DESCRIPTION

The following embodiments describe a method for delivering scan test data serially into an integrated circuit (IC) and the circuitry enabling the method.

It will be obvious, however, to one skilled in the art, that the present invention may be practiced without some or all of these specific details. In other instances, well-known operations have not been described in detail in order not to unnecessarily obscure the present invention.

The current invention entails a method to deliver scan test data serially into an integrated circuit and the circuitry incorporated within the IC to enable the method. The advantage of using high speed serial protocol is that the data transmission can be relatively fast and the test interface can be universal. The serial scan test data delivery method can be significantly faster if using one of the high speed serial protocols. In order to utilize such high speed serial protocols, the IC will need to incorporate DFT circuitry which enables delivering the scan test data serially. The DFT circuitry receives the scan test data serially and routes the data internally to the appropriate hardware for testing. The embodiments also reduce costs associated with the testing. Typically, the cost of the hardware mounted on the tester for delivering scan test data serially is significantly lower than the hardware required for delivering scan test data in parallel because of difference in interface design requirement and tester resource requirement. As an example, the serial scan test data delivery method requires only 4 IO resources from the tester in contrast to parallel testing which may require >100 resources with the data at slower speed, in one embodiment.

Figure 1A:
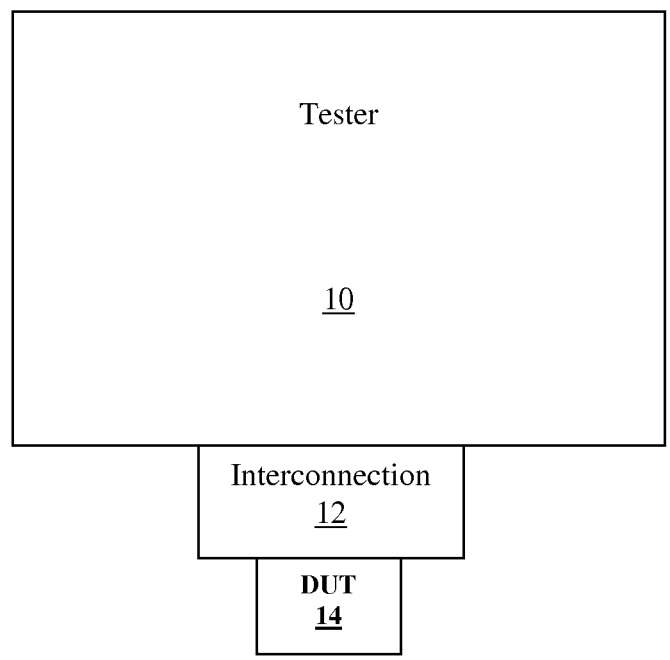
FIG. 1A, meant to be illustrative and not limiting, shows a simplified test setup utilized within an integrated circuit industry in accordance with one embodiment of the invention.

FIG. 1A, meant to be illustrative and not limiting, illustrates a simplified testing setup in accordance with one embodiment of the invention. FIG. 1A shows a tester 10 which is coupled to the device under test (DUT) 14 via an interconnection 12. Example of testers in a test fields are automatic testing equipment (ATE), or manual testing equipment. One skilled in the art will appreciate that the ATE or manual testing equipment is capable of driving in a test signal and reading out a test signal during the test process. The interconnection 12 is also known to a person skill in the art as DUT hardware. The interconnection 12 is an intermediate interface which routes the test signals to and from the tester 10 to the DUT 14. An example of the interconnection 12 includes a probe card and test socket. The DUT 14 is an integrated circuit (IC).

Figure 1B:
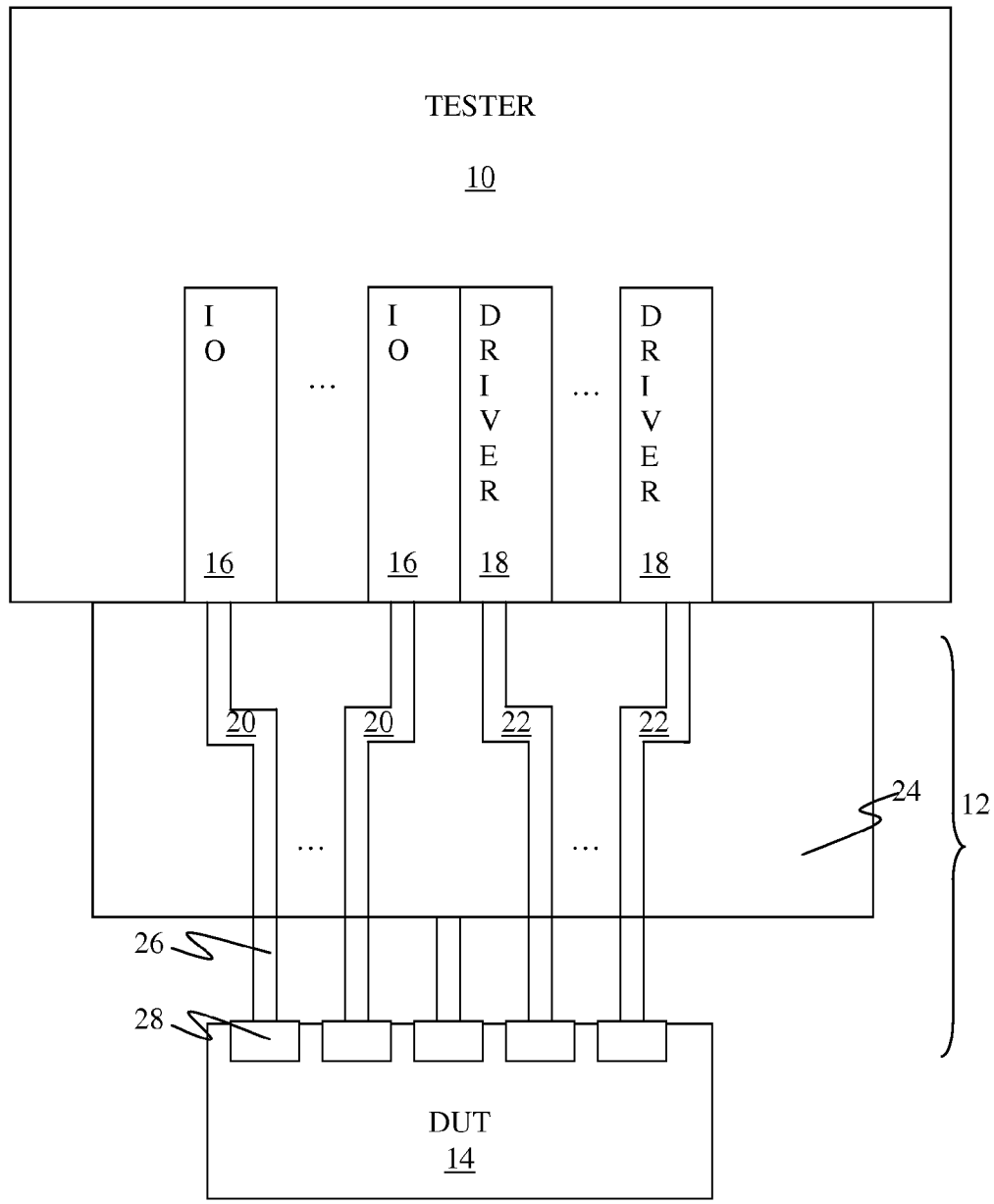
FIG. 1B, meant to be illustrative and not limiting, shows further details on the testing setup of FIG. 1A in accordance with one embodiment of the invention.

FIG. 1B, meant to be illustrative and not limiting, provides further details on the testing setup of FIG. 1A in accordance with one embodiment of the invention. The tester 10 includes a plurality of tester IO resources 16 and plurality of driver resources 18 each of which connects to the DUT 14 via the interconnection 12. The IO resource 16 is utilized for transferring an IO signal, such as a data signal. The driver resource 18 is utilized for driving in a driver signal, such as an address signals. One skilled in the art appreciated that the utilization of IO resources 16 and driver resources 18 is not to be restricted to functionalities as described within the embodiments.

Still referring to FIG. 1B, the interconnection 12 is coupled to the tester 10. Interconnection 12 typically includes 2 layers, which may be referred to as a printed circuit board (PCB) layer 24 and a PCB-DUT interface layer 26. In one embodiment, the PCB layer 24 is coupled to the tester 10. The IO resource 16 within the tester 10 is coupled to an IO trace 20 and the driver resource 18 in the tester 10 is coupled to driver trace 22. One skilled in the art knows that the dimension of the traces within the PCB layer 24 is subject to the requirement of the test signal with regards to speed, noise and power. The common problem faced in the industry is achieving optimized conditions under the tight pitch traces within the PCB layer 24 when there are a large number of IO/Driver resource requirements to maintain speed and performance requirements. The PCB-DUT interface layer 26 is coupled to the PCB layer 24 and the DUT 14. Examples of the PCB-DUT interface layer 26 are probe tips, pogo pins, etc. The PCB-DUT interface layer 26 is coupled to the DUT 14 via a pad 28. The pad 28 provides a first point of contact on the DUT 14 for signal transfers. The pad 28 of the DUT 14 can be any suitable conductive interface, such as surface mounted devices (SMD) pads, ball grid array (BGA) balls, and wafer bond pads.

The interconnection 12, plurality of IOs 16 and plurality of driver resources 18 requirements vary based on the type of testing method. In one embodiment, a serial data delivery method is used. The serial data delivery method requires fewer resources from the tester 10 because the serial nature enables multiple IO data to be transmitted through a single IO pad in contrast to the parallel data delivery method. Serial data delivery method could also reduce the interconnection 12 complexity designs wherein the number of traces within the PCB layer 24 can be significantly reduced and hence designed for better speed, noise and power.

Figure 2:
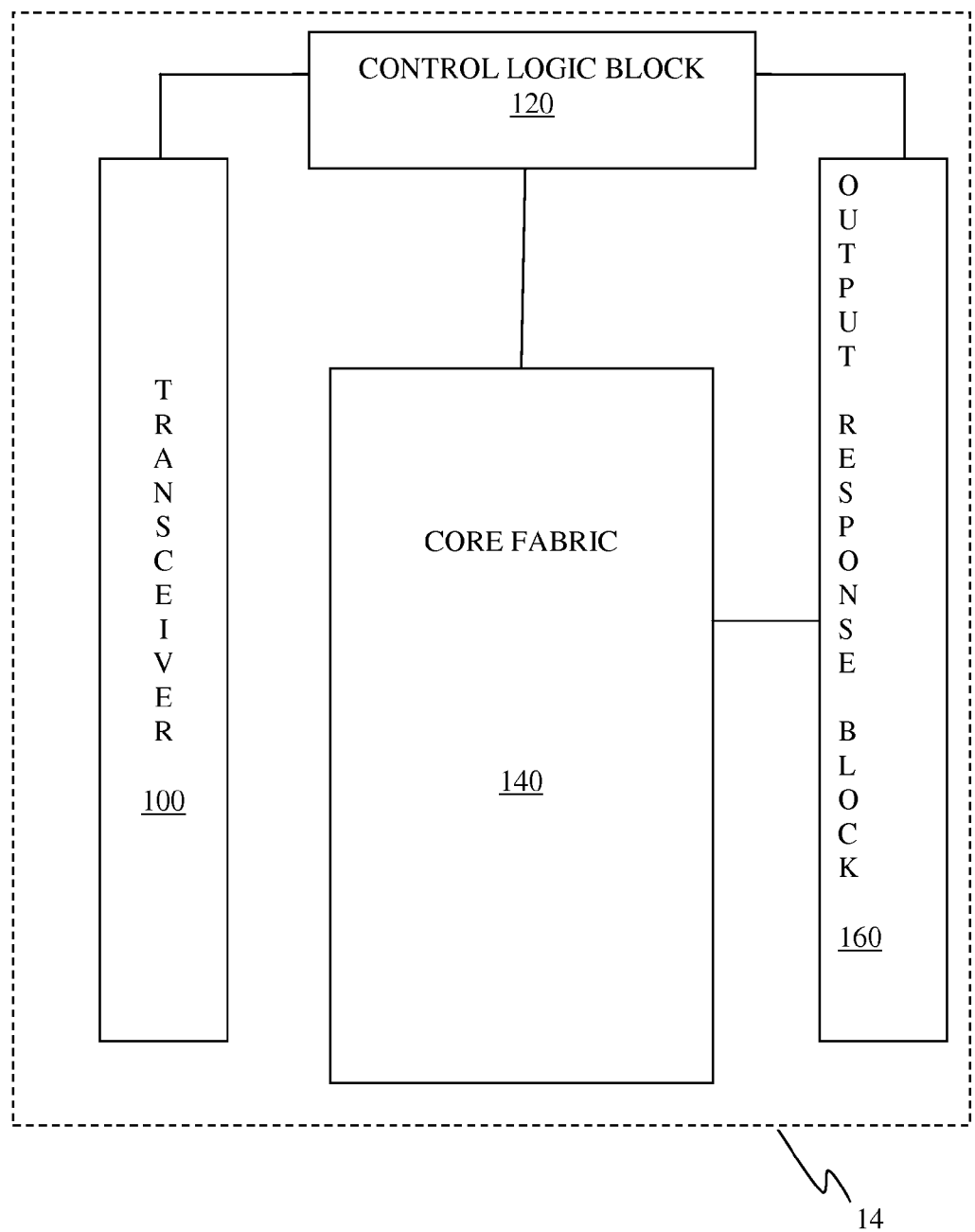
FIG. 2, meant to be illustrative and not limiting, shows an exemplary of device under test (DUT) design for test circuitry for method to deliver scan test data serially in accordance with one embodiment of the invention.

FIG. 2, meant to be illustrative and not limiting, shows an exemplary of device under test (DUT) circuitry to enable the delivery of scan test data serially. The DUT circuitry includes a transceiver block 100, control logic block 120, core fabric 140 and output response block 160. The transceiver block 100 is used to transfer the serial scan test data in or out of the DUT 14. The transceiver block 100 deserializes the serial scan test data into a deserialized scan test data when transferring in the data. In contrast, the transceiver block 100 serializes the deserialized scan test data into serial scan test data when transferring out the data. In one embodiment, the transceiver block 100 has standard serial protocol circuits to receive or transmit a standard serial protocol scan test data. Standard serial protocol circuits allows for a single united test interface which can be common across different types of DUTs. An exemplary embodiment of the standard serial protocol is PCI-Express. The standard serial protocol circuit has capabilities to transfer and receive the data based on PCI-Express protocol standards. Other exemplary embodiment includes but is not limited to, Universal Serial Bus (USB), RapidIO or Serial Automatic Testing Attachment (SATA).

Still referring to FIG. 2, the transceiver block 100 is coupled to the control logic block 120. The deserialized scan test data from the transceiver block 100 is transferred to the control logic block 120. An example of a control logic block within this embodiment is a design for test (DFT) circuitry. The DFT circuitry includes sequential circuits and storage elements. In one embodiment, the storage elements may be flip-flops, registers, or Static Random Access Memory (SRAM). The scan test data contains information on stimulus and pathway of the stimulus propagation. In one embodiment, the DFT circuitry within the control logic block 120 utilizes the deserialized scan test data and generates a stimulus and information of the way the stimulus will propagate across the core fabric. The control logic block 120 is coupled to a core fabric 140 and output response block 160. One example of the core fabric 140 includes combinatorial logic. A person skilled in the art will identify combinatorial logic to be classified from simple logic structure to complex logic structure. As the stimulus propagates across the core fabric 140, the core fabric 140 will generate an output response. The core fabric 140 is coupled to the output response block 160. The output response will then be transferred into the output response block 160. The output response block 160 includes circuits to receive the output response from the core fabric and circuits to perform a comparison between the output response and expected output response. In one embodiment, the output response block includes a Linear Feedback Shift Register (LFSR). The LFSR compares the output response, which is generated after the stimulus propagates across the core fabric 140, with an expected response, which is provided to the LFSR from an external source. The comparison provides a decision to determine if the DUT passes or fails the test.

Figure 3:
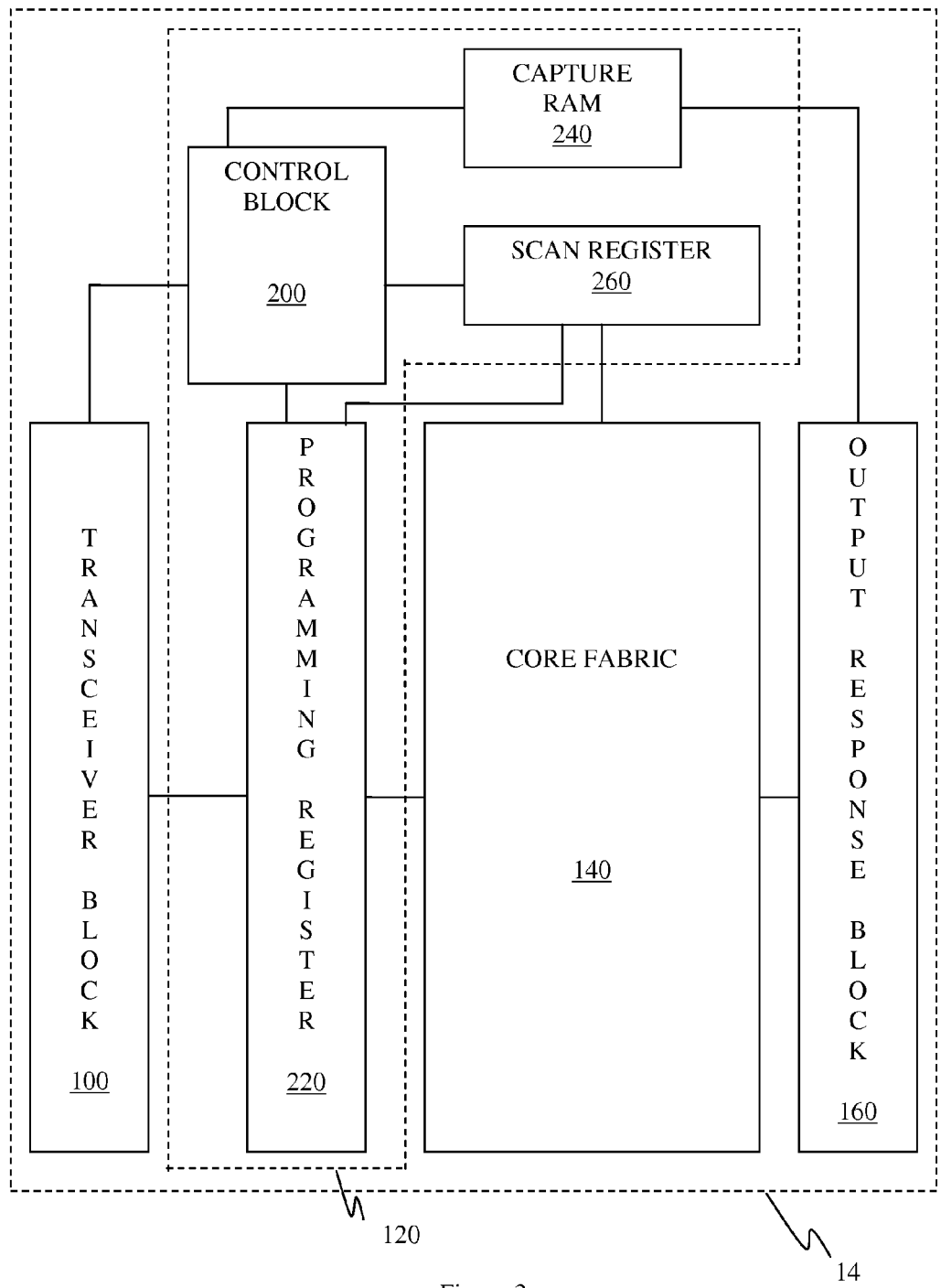
FIG. 3, meant to be illustrative and not limiting, shows details within control logic block in accordance with one embodiment of the invention.

FIG. 3, meant to be illustrative and not limiting, shows details within control logic block 120. The control logic block 120 includes a control block 200, a programming register 220, a scan register 260, and a capture random access memory (RAM) 240. The control block 200 is identified to be a subset of control logic block 120. In one embodiment, the control block 200 includes a sequential logic circuit. The sequential logic circuit is expected to produce an output based on the input of data. A person skill in the art will appreciate that the sequential logic circuit includes a state machine. The state machine transfers appropriate signals based on a current state of the state machine. In the embodiment, the control block 200 processes the deserialized scan test data using the sequential logic circuits and produces a control signal which controls the flow of the test method within the IC. The control signals generated by the sequential logic circuits within the control block 200 controls the activation and functionalities of the programming register 220, scan register 260 and Capture RAM 240. In one embodiment, there are at least 4 control signals which could be generated to control the test flow. These four control signals include activation of programming register 220, programming the scan register 260, propagation of stimulus across the core fabric 140, and transferring the output response to output response block 160.

Still referring to FIG. 3, the programming register 220 is coupled to the control block 200 and transceiver block 100. Once the control block 200 provides the control signal which carries an activation signal to programming register 220, the deserialized scan test data from the transceiver block 100 is transferred to the programming register 220. The deserialized scan test data which is transferred to programming register 220 contains information on programming the scan register 260 and the type of stimuli needs to be generated for it to be routed to the core fabric 140. The programming registers 220 then, after receiving the next control signal from the control block 200, programs multiple scan registers 260 in parallel and generates the stimuli generated from the information received from deserialized scan test data. The scan register 260 includes a shift register. The scan register 260 shifts the stimulus from the programming register 220 to the core fabric 140 and then across the core fabric 140. The scan register 260 also includes storage elements which store information on how the stimulus is routed and propagated through the core fabric 140 from programming register 260. The capture RAM 240 is coupled to the control block 200 and the output response block 160. Capture RAM 240 is utilized to store information contained within the scan register 260 and the output response generated by the core fabric 140 after the stimuli is propagated across the core fabric. The Capture RAM 240 includes storage elements. In one embodiment, the information within capture RAM 240 can be routed out of the DUT via an external interface a failure is identified through the output response block 160. The information may be used to perform failure analysis, device marginalities study, process improvement, etc.

Figure 4:
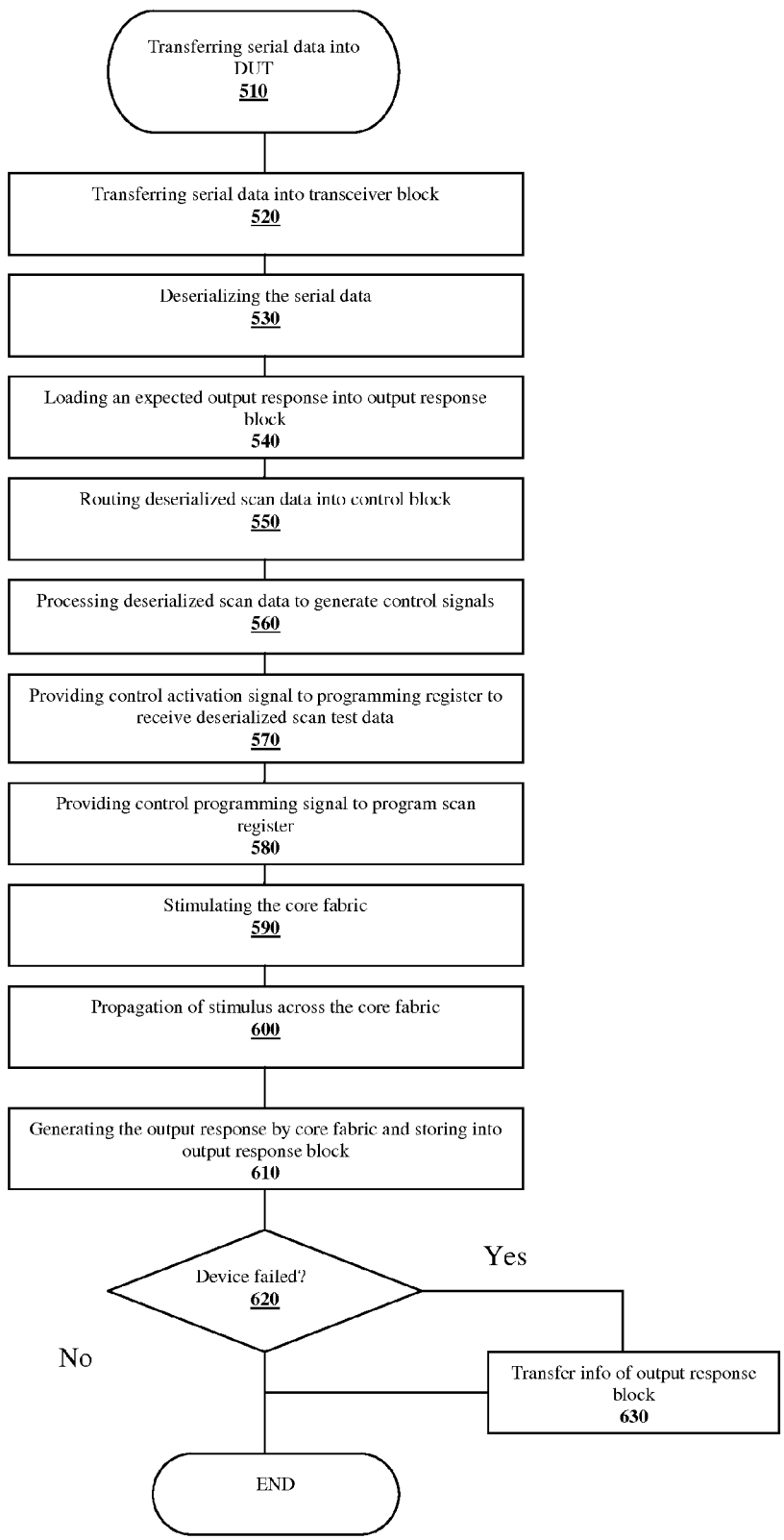
FIG. 4, meant to be illustrative and not limiting, shows a simplified flow chart on the method to deliver scan test data serially into an integrated circuit (IC) in accordance with one embodiment of the invention.

FIG. 4, meant to be illustrative and not limiting, shows a simplified flow chart 500 for delivering scan test data serially to an integrated circuit (IC) in accordance with one embodiment of the invention. Serial scan test data is transferred into the DUT as shown in FIG. 1 via the 10 pad in operation 510. The serial scan test data is then transferred to the transceiver block which is depicted in FIG. 3, in operation 520. An exemplary embodiment of serial scan test data includes standard serial protocol, eg. PCI-Express. The serial scan test data will then be deserialized within the transceiver block designed with appropriate circuits in operation 530. The expected output response is loaded into the output response blocks in operation 540. In one embodiment, the output response generated from the core fabric may be compared with the expected output response to determine if the DUT pass or fails the test as mentioned below. The deserialized scan test data is routed to the control block in operation 550. The control block will then process the deserialized scan test data and generates a control signal which controls the test mechanism within the circuit in operation 560. The control block then provides an activation control signal to the programming register which receives the deserialized scan test data in operation 570. The deserialized scan test data includes stimulus which will be routed to the core fabric and the programming information of the scan register. The control block will then provide another control signal which carries information to the programming register, to program the scan register with information of the routing through the core fabric in operation 580.

Still referring to FIG. 4, the control block provides a control signal carrying information for the programming register to stimulate the core fabric in operation 590. The stimulus propagates across the core fabric based on the route programmed from the scan register in operation 600. The core fabric produces an output response and the output response is transferred to the output response block in operation 610. The circuits within the output response block compare the output response generated from the core fabric with the expected output response in operation 620. In one embodiment, where the output response block is a Linear Feedback Shift Register (LFSR), the expected output is compared to the output response generated by the core fabric through the LFSR. The information within the scan register and output response block is then stored within the capture RAM in operation 620. The stored information from the capture RAM is transferred out of the device, e.g., a tester, if the decision from the output response block indicates failure in operation 630.

The embodiments, thus far, were described with respect to integrated circuits. The method and apparatus described herein may be incorporated into any suitable circuit. For example, the method and apparatus may be incorporated into numerous types of devices such as microprocessor or programmable logic devices. Exemplary of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just name a few.

The programmable logic device described herein may be part of a data processing system that includes one or more of the following components; a processor; memory; IO circuits;

and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method of operations were described in a specific order, it should be understood that other operation may be performed in between described operations, described operations may be adjusted so that they occur at slightly different times or described operations may be distributed in a system which allows occurrence of the processing operation at various intervals associated with the processing, as long as the processing of the overlay operations are performed in a desired way.

Although the foregoing invention has been described in some detail for the purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit (IC) comprising:
   a transceiver block which receives serial data and converts the serial data to deserialized data;
   a control logic block which receives the deserialized data from the transceiver block and generates stimulus for testing the IC, wherein the control logic block includes a control block, a scan register, and a programming register;
   a core fabric which receives the stimulus from the control logic block and propagates the stimulus through the core fabric based on clock cycles through a shift register; and
   an output response block for receiving output from the core fabric, wherein the control logic block further includes a Capture RAM to store information contained within the scan register and the output response block from the core fabric.

2. The IC in claim 1 wherein the control block is a state machine which sequentially processes the deserialized data and generates control signals which control a test mechanism within the IC.

3. The IC in claim 1 wherein the scan register within the control logic block routes and shifts the stimulus across the core fabric.

4. The IC in claim 1 wherein the programming register within the control logic block stimulates the core fabric and programs the scan register.

5. The IC in claim 1 wherein the output response block is a linear feedback shift register (LFSR).

6. The IC in claim 1 wherein the core fabric includes combinatorial logic.

7. A method of testing an integrated circuit (IC) comprising:
   receiving serial data at a transceiver block of the IC;
   deserializing the serial data into deserialized data in the transceiver block;
   transmitting the deserialized data to a programming register;
   stimulating a core fabric of the IC based on the deserialized data in the programming register;
   capturing output generated from the core fabric in response to the stimulating, and comparing the captured output with an expected output; and
   transferring the captured output out of the IC when the comparing indicates a device failure.

8. The method of claim 7 further comprising:
   loading an expected output response to an output response block.

9. The method in claim 7 further comprising:
   comparing the output to an expected output response and determining whether the IC passes testing based on the comparing.

10. The method in claim 7 further comprising:
    storing information of stimulus propagation and core fabric routability into a scan register.

11. The method in claim 7 wherein the receiving is performed according to a standardized serial protocol.

12. The method in claim 11 wherein the standardized serial protocol is one of PCI-Express, USB, SATA, or RapidIO format.

13. The method in claim 7 further comprising:
    storing the output generated from the core fabric and information contained in a scan register into a Capture RAM.

14. The method in claim 13 further comprising:
    transferring the stored data within the Capture RAM through the transceiver block of the IC.

15. A design-for-test (DFT) circuitry comprising:
    a transceiver block which receives serial data and converts the serial data into deserialized data;
    a control logic block which receives the deserialized data from the transceiver block and stimulates at least one test element with test data and stores the test data for future transfer when the DFT circuitry fails; and
    an output response block which receives output from the test element and compares the output with an expected output and generates a result.

16. The DFT circuitry in claim 15, wherein the output response block transfers the result out of the DFT circuitry through the transceiver block.

17. The DFT circuitry in claim 15, wherein the transceiver block has standard serial data protocol circuits to transfer a standard serial protocol data.

18. The DFT circuitry in claim 15, wherein the control logic block provides stimulus and routing information on the DFT circuitry of which the stimulus propagates across a core fabric.

* * * * *